March 9, 1965 R. PERETZ 3,173,098

SERIES-PARALLEL TRANSISTOR AMPLIFIER

Filed Oct. 17, 1962

INVENTOR
Richard PERETZ
BY

ATTORNEYS

United States Patent Office
3,173,098
Patented Mar. 9, 1965

3,173,098
SERIES-PARALLEL TRANSISTOR AMPLIFIER

Richard Peretz, Watermael-Boitsfort, Belgium, assignor to Ateliers de Constructions Electriques de Charleroi (ACEC), Brussels, Belgium, a joint-stock company of Belgium Filed Oct. 17, 1962, Ser. No. 231,148
1 Claim. (Cl. 330—24)

The present invention relates to a new type of direct coupling transistor amplifier, which is a transistorized version of the electronic tube series-parallel amplifier disclosed in Belgian Patent No. 524,847, filed by the instant applicant on December 5, 1953.

It is, therefore, an object of the invention to provide a direct coupling transistor amplifier having a differential input whereby the effects of temperature variations are compensated.

Another object of the invention lies in the provision of a differential input transistor amplifier having a high gain.

A further object of the invention is to provide a transistor amplifier having a low output impedance and a high input impedance.

The series-parallel amplifier according to the invention is characterized in that it comprises two transistors, having a common emitter resistance, to the base-emitter circuits of which are respectively applied two symmetrical input signals, the collector of the first of these transistors being connected to the power supply through a resistance and the collector of the second transistor being connected to the same power supply through the emitter-collector circuit of a third transistor, the base of which is joined to the collector of the first transistor and to a grounded diode, so that the last collector may never become positive, and the output of the amplifier being connected to the point common to the collector of the second transistor and to the emitter of the third one.

According to an improved form of the invention, the voltage supply end of the collector resistance of the first transistor is joined to the point common to a Zener diode and to a resistance connected to the negative pole of the power supply, this Zener diode being connected, on the other hand, to the emitter of the third transistor to thus maintain the current in the collector resistance of the first transistor at a constant value.

Other features and advantages of the invention will become apparent as the following description proceeds having regard to the annexed drawings wherein.

In the two figures of drawings, the same reference numerals will identify the elements playing the same parts, although the general characteristics of these elements may be different.

Figure 1:
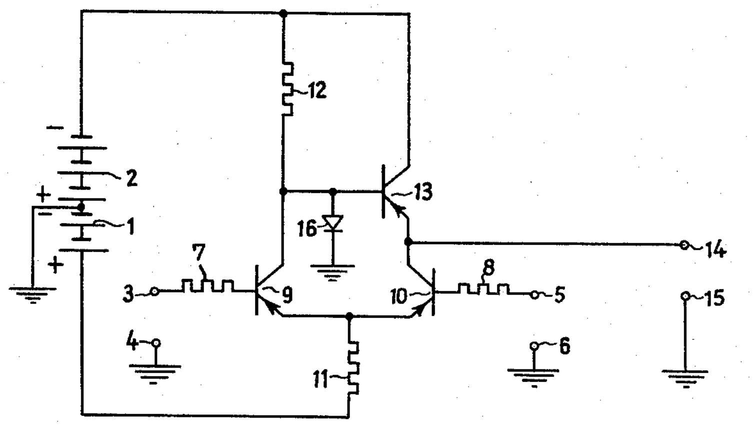
FIGURE 1 is an electrical diagram of a transistor series-parallel amplifier according to the invention.

The amplifier illustrated in FIGURE 1 is fed by two D.C. voltage sources 1 and 2 connected in series and the common point of which is at zero potential illustrated here by ground. The amplifier has two symmetrical inputs, the terminals of which are respectively identified by numerals 3, 4 and 5, 6, and are connected through resistances 7 and 8, to the base circuits of two transistors 9 and 10, the emitters of which are joined to a common resistance 11.

The collector of transistor 9 is connected to the power supply through a resistance 12, and the collector of transistor 10 is fed through the emitter-collector circuit of a third transistor 13, the base of which is joined directly to the collector of transistor 9.

The output of the amplifier, the terminals of which are identified by numerals 14 and 15, is located between the point common to the collector of transistor 10 and to the emitter of transistor 13 and ground.

The signals applied on the two inputs being symmetrical, if, for instance, the current in the collector of transistor 10 increases, the current in the collector of transistor 9 decreases. This decrease brings about a less voltage drop across resistance 12, wherefrom the base potential of transistor 13 increases negatively in relation to ground and, the base current increasing, the collector current of transistor 13 increases. There is, therefore, a positive feed-back which results in a notable increase in the gain of the amplifier.

In order to prevent the point common to the collector of the transistor 9 and to the base of the transistor 13 from becoming positive with respect to the ground, which would block the amplifier, a diode 16 is connected between this common point and the ground, in the appropriate direction. The "emitter-follower" connection of transistor 13 provides a low output impedance and the input impedance is increased due to the differential effect.

Figure 2:
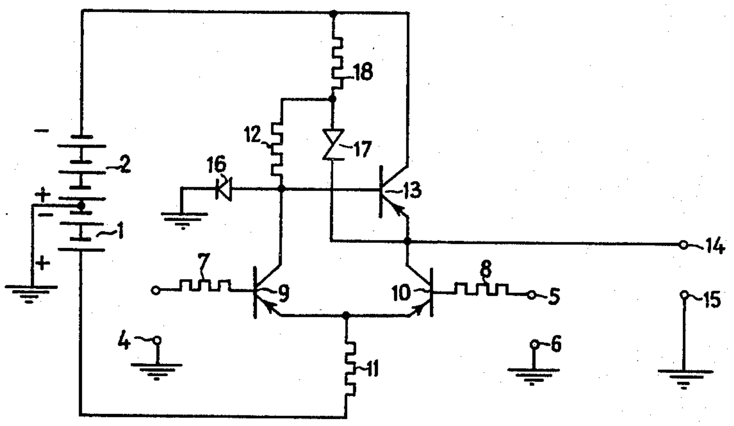
FIGURE 2 is a diagram of the same amplifier improved by the addition of a Zener diode.

On FIGURE 2, the diagram of the same amplifier is illustrated, but with the difference that the collector resistance 12 of transistor 9 is not directly connected to the negative terminal of the power supply but to a voltage divider comprising a Zener diode 17 connected, on the one hand, to the emitter of transistor 13 and, on the other hand, through resistance 18, to the negative pole of the power supply. The purpose of the Zener diode 17 is to keep the current in this resistance 12 constant, wherefrom results a considerable increase of the gain of the amplifier.

Obviously, various changes may be made to the above described series-parallel amplifier without departing from the spirit of the invention.

I claim:

A direct coupling series-parallel amplifier having two symmetrical inputs, comprising in combination a first, a second and a third transistor, each having a base, an emitter and a collector, a D.C. power supply having an intermediate tap connected to ground, a common resistive connection between the emitters of said first and second transistors and the positive terminal of the power supply, means for applying a first input signal between the base of said first transistor and the ground, means for applying a second input signal, symmetrical to the first one, between the base of said second transistor and the ground, a voltage divider comprising a resistance and a Zener diode in series, said resistance being connected to the negative terminal of the power supply and said Zener diode being connected to the collector of the second transistor, a resistive connection between the collector of said first transistor and said voltage divider, said Zener diode thus maintaining the current in said resistive connection at a constant value, means for connecting the collector of said second transistor to the negative terminal of the power supply through the emitter-collector circuit of said third transistor, a connection to the ground, through a diode, common to the collector of said first transistor and the base of said third transistor, said diode preventing the collector of the first transistor from becoming positive, and means for connecting the output load between the ground and the point common to the collector of said second transistor and to the emitter of said third transistor.

References Cited by the Examiner

UNITED STATES PATENTS

| | | | |
|---|---|---|---|
| 3,054,068 | 9/62 | De Jong | 330—24 |
| 3,080,528 | 3/63 | Davidson | 330—24 X |

FOREIGN PATENTS

| | | |
|---|---|---|
| 524,847 | 4/56 | Belgium. |

ROY LAKE, *Primary Examiner.*

NATHAN KAUFMAN, *Examiner.*